United States Patent [19]

Baker

[11] E Re. 31,523

[45] Reissued Feb. 14, 1984

[54] CRYSTALLESS SCANNING RADIO RECEIVER AND TRANSMITTER

[75] Inventor: William Baker, Indianapolis, Ind.

[73] Assignee: Masco Corporation of Indiana, Taylor, Mich.

[21] Appl. No.: 265,432

[22] Filed: May 20, 1981

Related U.S. Patent Documents

Reissue of:

[64] Patent No.: 4,156,193
Issued: May 22, 1979
Appl. No.: 802,889
Filed: Jun. 2, 1977

U.S. Applications:

[63] Continuation-in-part of Ser. No. 689,364, May 24, 1976, Pat. No. 4,092,594, which is a continuation-in-part of Ser. No. 582,338, May 30, 1975, Pat. No. 3,962,644.

[51] Int. Cl.[3] ..... H04B 1/38

[52] U.S. Cl. ..... 455/76; 455/77; 455/165

[58] Field of Search ..... 455/75, 76, 77, 165

[56] References Cited

U.S. PATENT DOCUMENTS

| | | | |
|---|---|---|---|
| 3,962,644 | 6/1976 | Baker | 325/459 |
| 3,983,484 | 9/1976 | Hodama | 325/21 |
| 4,009,451 | 2/1977 | Moore et al. | 325/25 |
| 4,013,957 | 3/1977 | Tojo | 325/464 |
| 4,027,242 | 5/1977 | Yamanaka | 325/25 |
| 4,145,656 | 3/1979 | Merryman et al. | 455/76 |

*Primary Examiner*—Marc E. Bookbinder
*Attorney, Agent, or Firm*—Neuman, Williams, Anderson & Olson

[57] ABSTRACT

A receiver and transmitter apparatus is disclosed which is of the superheterodyne type and is capable of scanning a plurality of channels and receiving and transmitting on such channels. The apparatus incorporates a phase-locked-loop frequency synthesizing means for generating beating signals for use in tuning specific channels and also incorporates means for controlling the frequency synthesizing means and the overall receiver and transmitter operation. The apparatus includes a display for viewing information during its operation.

24 Claims, 9 Drawing Figures

28
106
107
108
110
111
112
113
115
116
117
118
120
121
122
123
125
126
127
128
130
131
MC4044
SN74S163
SN7473
SN74163
SN74S112
SL610
3.579545 MHZ
LSB
AM
USB
FROM 105 (FIG. 3c)
(FIG. 3a)
C (FIG. 3b)

CRYSTALLESS SCANNING RADIO RECEIVER AND TRANSMITTER

Matter enclosed in heavy brackets [ ] appears in the original patent but forms no part of this reissue specification; matter printed in italics indicates the additions made by reissue.

This is a continuation-in-part of application Ser. No. 689,364, filed May 24, 1976, now U.S. Pat. No. 4,092,594 which, in turn, is a continuation-in-part of application Ser. No. 582,338, filed May 30, 1975, now U.S. Pat. No. 3,962,644.

This invention generally relates to radio communication apparatus and, more particularly, to a receiving and transmitting apparatus which can automatically scan a plurality of radio frequency channels and can also transmit on various channels.

Normally, in radio receiving and transmitting apparatus, such as a citizen band radio, the operator manually selects the channel on which he desires to listen or broadcast. The switching of channels has been accomplished by switching one of a plurality of different crystals into a crystal oscillator tuning circuit. In other models, a frequency synthesizer has been manually switched in frequency to produce the beating frequency for selecting the various channels. With such apparatus, it was necessary to manually switch channels to locate one on which there was a desired transmission or to find a clear channel for transmission.

Radio receivers which are capable of scanning a number of channels to locate an active transmission are now well known. Such receivers permit the monitoring of several predetermined frequency channels because of the capability of automatically and sequentially scanning through predetermined channels and stopping on a particular channel in the event a radio frequency signal is present and is received on the channel at that time. Upon termination of the signal, which usually occurs in a relatively short time because the bands are used for communication by police, fire departments, and other departments, agencies and the like, the receiver resumes the scanning process to determine if other radio frequency channels are active. Many of the receivers, in the prior art, monitor certain selected channels by selectively introducing or switching one of a plurality of different crystals into a crystal oscillator tuning circuit that generates the desired oscillator output beating signals for tuning the desired channel.

Scanning receivers have also utilized a frequency synthesizer to produce the beating frequencies for selecting the various channels and such receivers are the subject of a patent to Peter W. Pfasterer, U.S. Pat. No. 3,961,261, and a U.S. Pat. to Baker No. 3,962,444.

An object of the present invention is to provide a crystalless transmitting-receiving apparatus that includes channel finding means for controlling a frequency synthesizing means so to cause the apparatus to scan to locate an active channel during a receive mode and to locate a clear channel for transmission.

Other objects and advantages will become apparent upon reading the following detailed description, while referring to the attached drawings in which.

Figure 2:
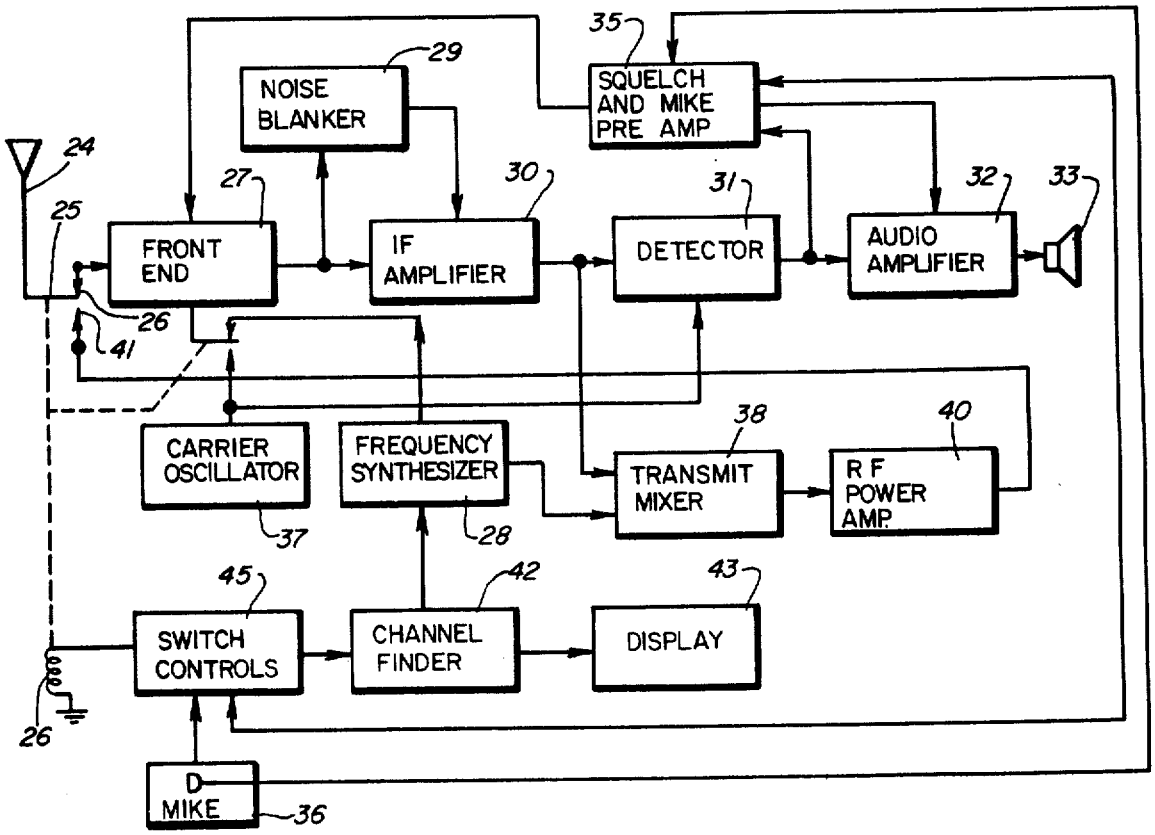
FIG. 2 is a block diagram of a transmitting-receiving apparatus constructed in accordance with the present invention.
Figure 4A:
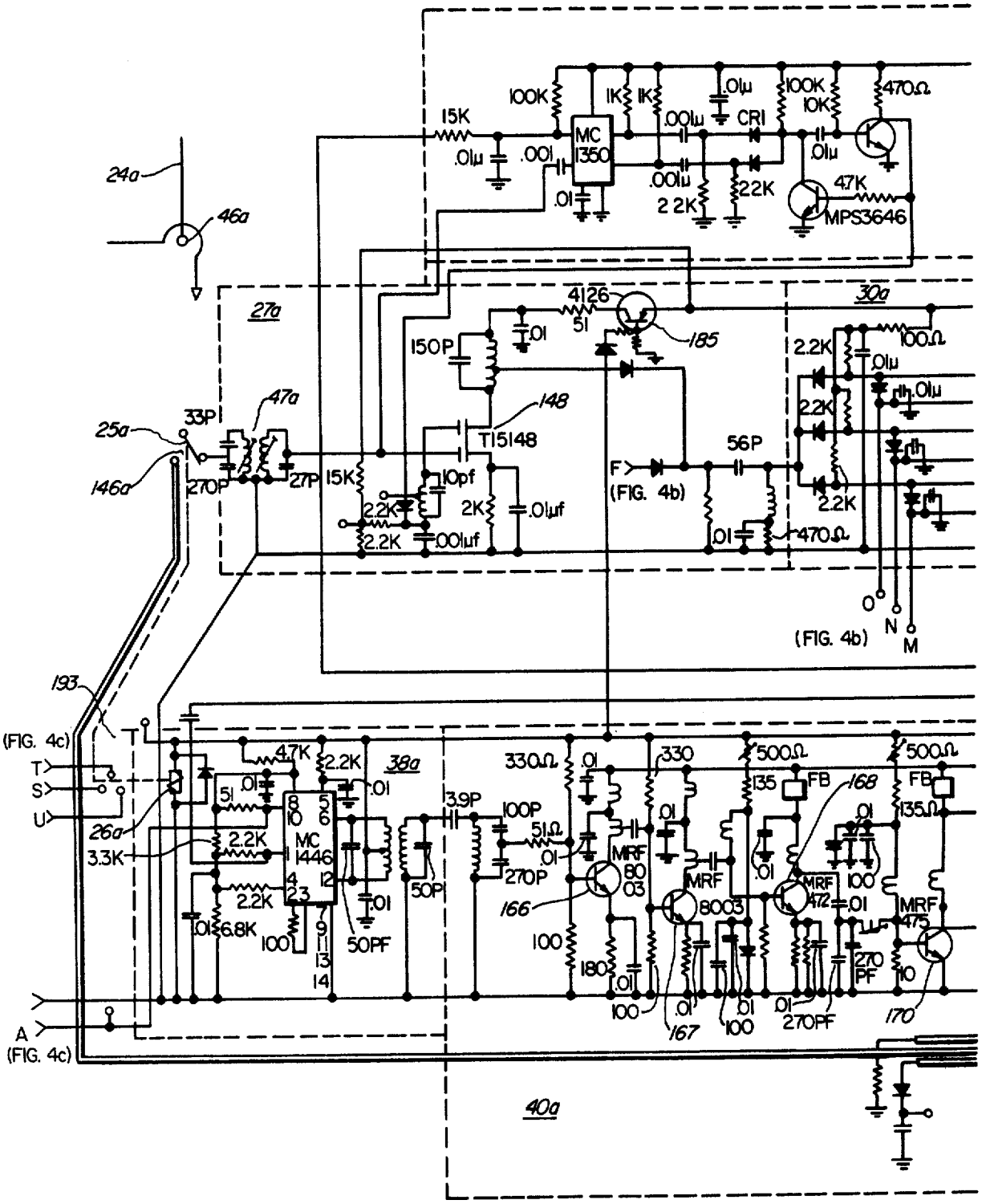
Figure 4A:
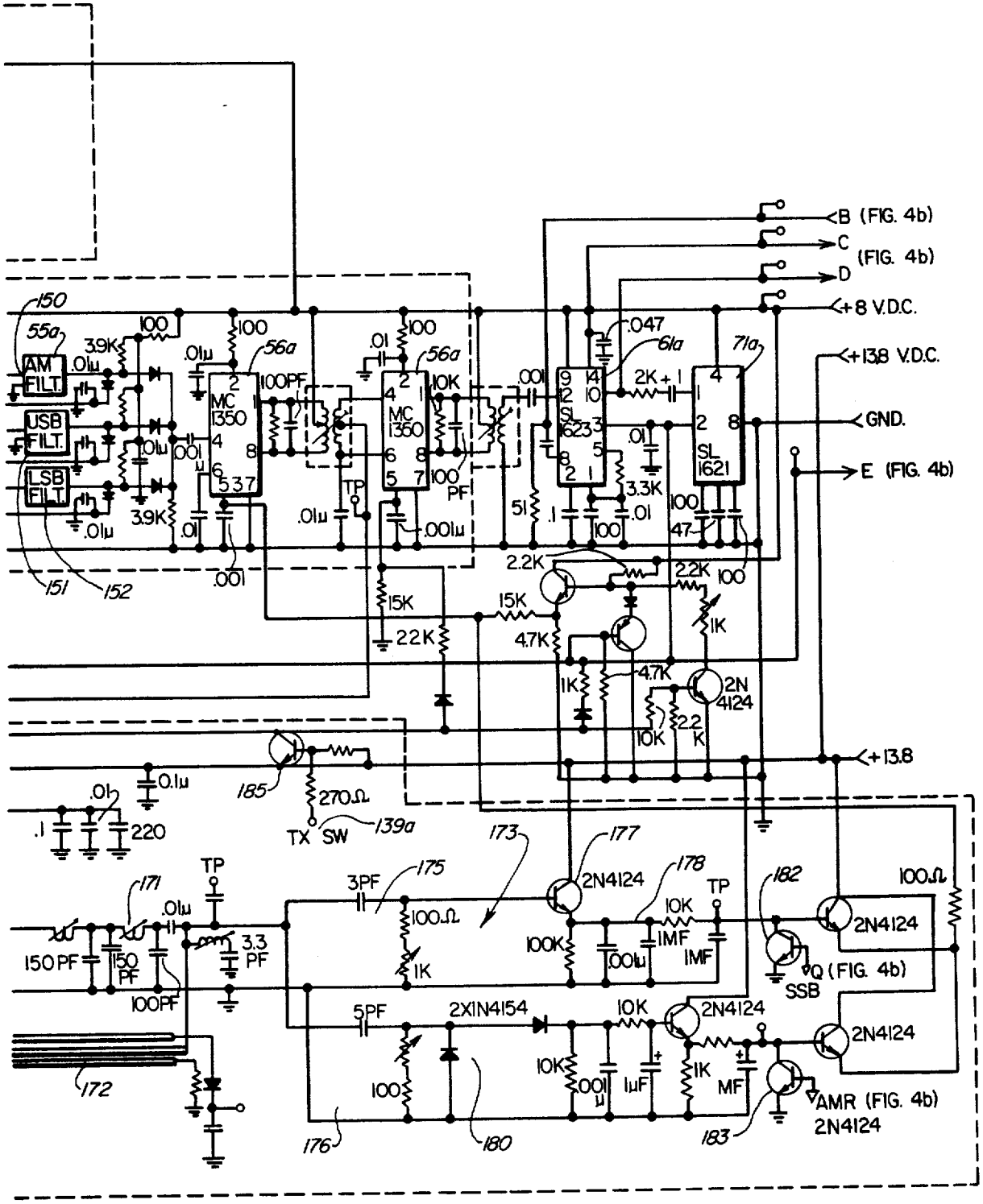
Figure 4B:
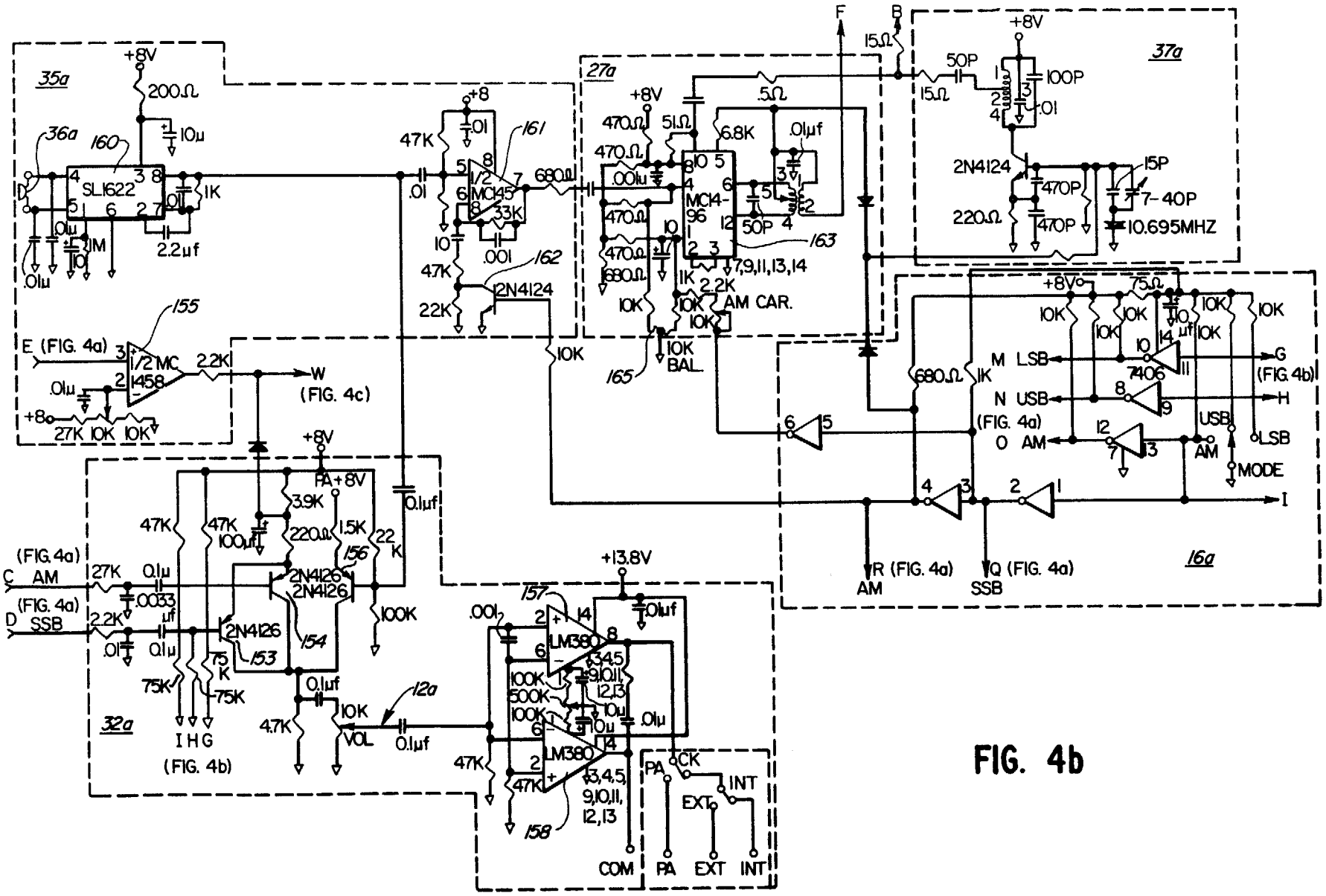
Figure 4C:
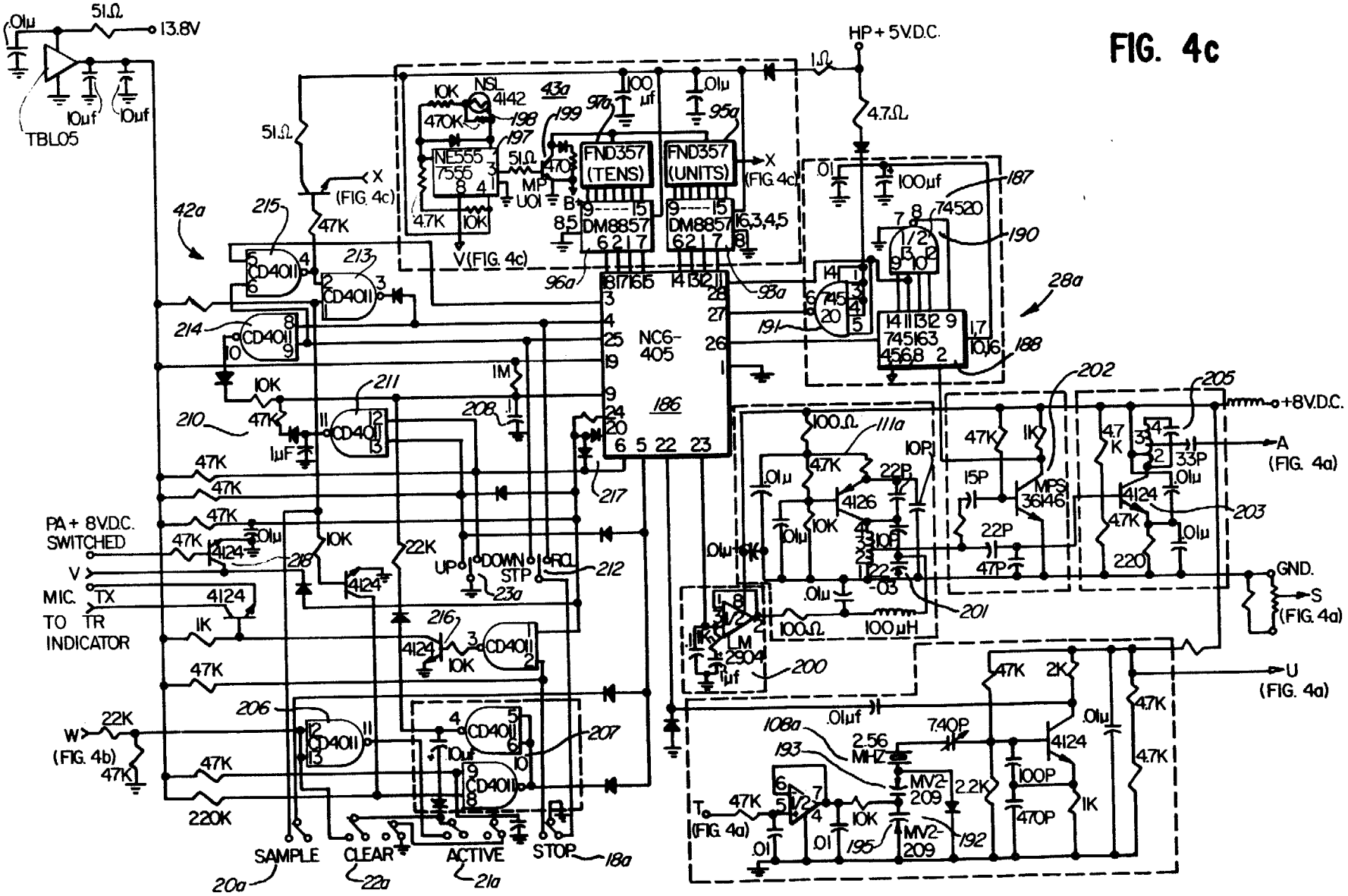

FIGS. 3A, 3B, 3C and 3D together are a schematic circuit of the transmitting-receiving apparatus shown in FIG. 2;

FIGS. 4A, 4B and 4C together are a schematic circuit of another embodiment of the transmitting-receiving apparatus.

Figure 1:
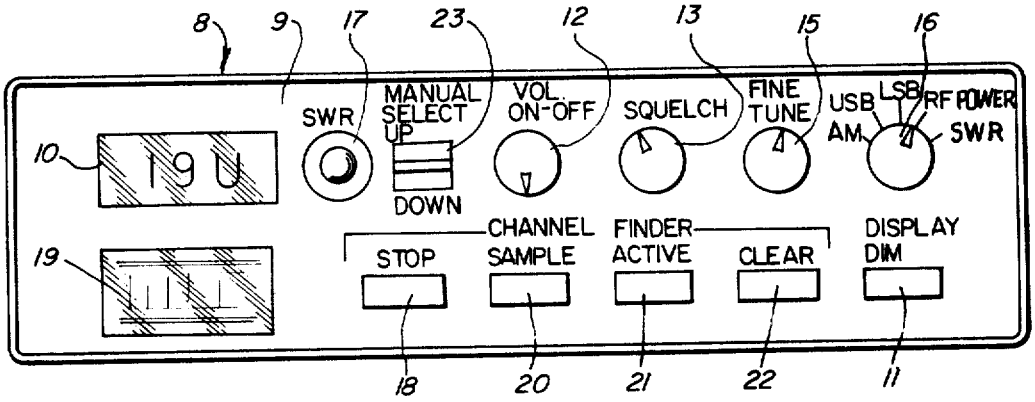
FIG. 1 is an enlarged view of a front panel of a transmitting-receiving apparatus embodying the present invention.

Turning now to the drawings, and particularly FIG. 1, the transmitting-receiving apparatus embodying the present invention will be broadly described with respect to its general operation. The apparatus has an enclosure 8 with a front panel 9 that has a visual display 10 in the upper left corner thereof for displaying channel information. The display may be dimed by a display dim switch 11 located at the lower right corner of the panel 9. A volume-on-off control knob 12, a squelch control knob 13 and a fine tune knob 15 are located in line across the top of the panel 9. A transmit-receive mode switch 16 is located in the upper right corner which switch selects the type of transmission or reception, that is amplitude modulation (AM), upper side band (USB) or lower side band (LSB), and also activates an RF power meter 19 in the lower left corner of the panel 9 and deactivates a SWR alarm indicator 17 adjacent the display. Four channel finder push button switches, namely, a stop switch 18, a sample switch 20, an active switch 21 and a clear switch 22, are located in line along the bottom of the panel 9 and are mechanically interconnected so that only one of the switches may be depressed at a time. A channel select up or down key 23, which is a return to center key, is located next to the SWR indicator 17.

Broadly stated, the receiver-transmitter apparatus embodying the present invention is adapted to operate in three different operational modes in finding a channel. When the stop button 18 is depressed, the channels may be incremented one channel for each actuation of the channel select key 23. By moving the channel select key 23 upward, the channel number is incremented up and by moving the key 23 downward the channel number is decremented down. Holding the key in either position automatically sequences the channels in the chosen direction. The channels may be automatically scanned either up or down in channel number by actuating the sample switch 20. The channels are scanned either up or down by channel number depending upon the direction of the last closure of the channel select key 23. Each channel is sampled for a preselected time set internally, for example three seconds, and the apparatus moves to the next channel regardless of whether or not there is a signal present (active channel). To stop the apparatus at a desired channel, the channel stop switch is depressed. The apparatus may be operated in an active channel finder mode wherein the channels are scanned and the apparatus locks on an active channel and resumes scanning when the transmission ceases. In the channel finder active mode, the active switch 21 is actuated and the apparatus quickly scans up or down in channel number depending upon the last position of the channel select key 23, stops when a received signal has a signal strength greater than a squelch level set by the squelch control 13 and remains there until that signal ceases. The apparatus also may be employed in a clear channel finder mode to locate a channel that is not being used or one having a low level of signal so that the operator can transmit on that channel. In the clear channel finder mode, the clear switch 22 is actuated and the apparatus quickly scans either up or down depending upon the last position of the up-down key, stops when a channel is receiving a signal having less strength than that set by the squelch control 13 and remains on that channel until that condition changes.

Generally, the transmitting-receiving apparatus for practicing the above-identified operations is shown in FIG. 2 and includes an antenna 24 connected, during receive, through a receive relay contact 26 of a transmit relay 25 to the input of the front end 27 of the apparatus. The front end 27 mixes the RF frequency received by the antenna 24, which may be AM, USB or LSB, with a local oscillator frequency generated by a frequency synthesizer 28 to provide an IF signal. Any impulse type noise in the IF signal is blanked by a noise blanker 29 that senses the impulse noise in the IF signal and disables and IF amplifier 30 which otherwise amplifies the IF signal. The output of the IF amplifier is applied to a detector 31 that provides an audio signal at its output. The audio signal is amplified by an audio amplifier 32 that drives a speaker 33. The detected audio signal is also applied to squelch and mike preamp circuit 35 that provide a squelch control signal indicating whether the audio signal is above or below a preset squelch level. This squelch control signal is applied to the audio amplifier 32 to disable the audio amplifier when the audio signal is below the squelch level. During transmit, the audio signal from a microphone 36 is amplified by the mike preamp circuit 35 and its output is applied to the front end 27 to amplitude modulate a carrier signal generated by a carrier oscillator 37. The AM signal is amplified by the IF amplifier 30 and the amplified AM signal is coupled to a transmit mixer 38. Provisions are also made to generate an USB or a LSB signal. At the mixer 38, the signal is mixed with the local oscillator signal generated by the frequency synthesizer 28 and the mixer output signal is amplified by a RF power amplifier 40. The output of the RF power amplifier 40 is applied through a transmit contact 41 of the transmit relay to the antenna 24.

The frequency generated by the frequency synthesizer 28 is selected by a channel finder 42 and the channel finder also causes the number of the selected channel to be displayed on a display 43. Switch controls 45, which includes the channel finder switches and the manual channel select switch 23 previously described, control the channel finder to cause the channel numbers to increment or decrement in accordance with the modes previously described.

Figure 3A:
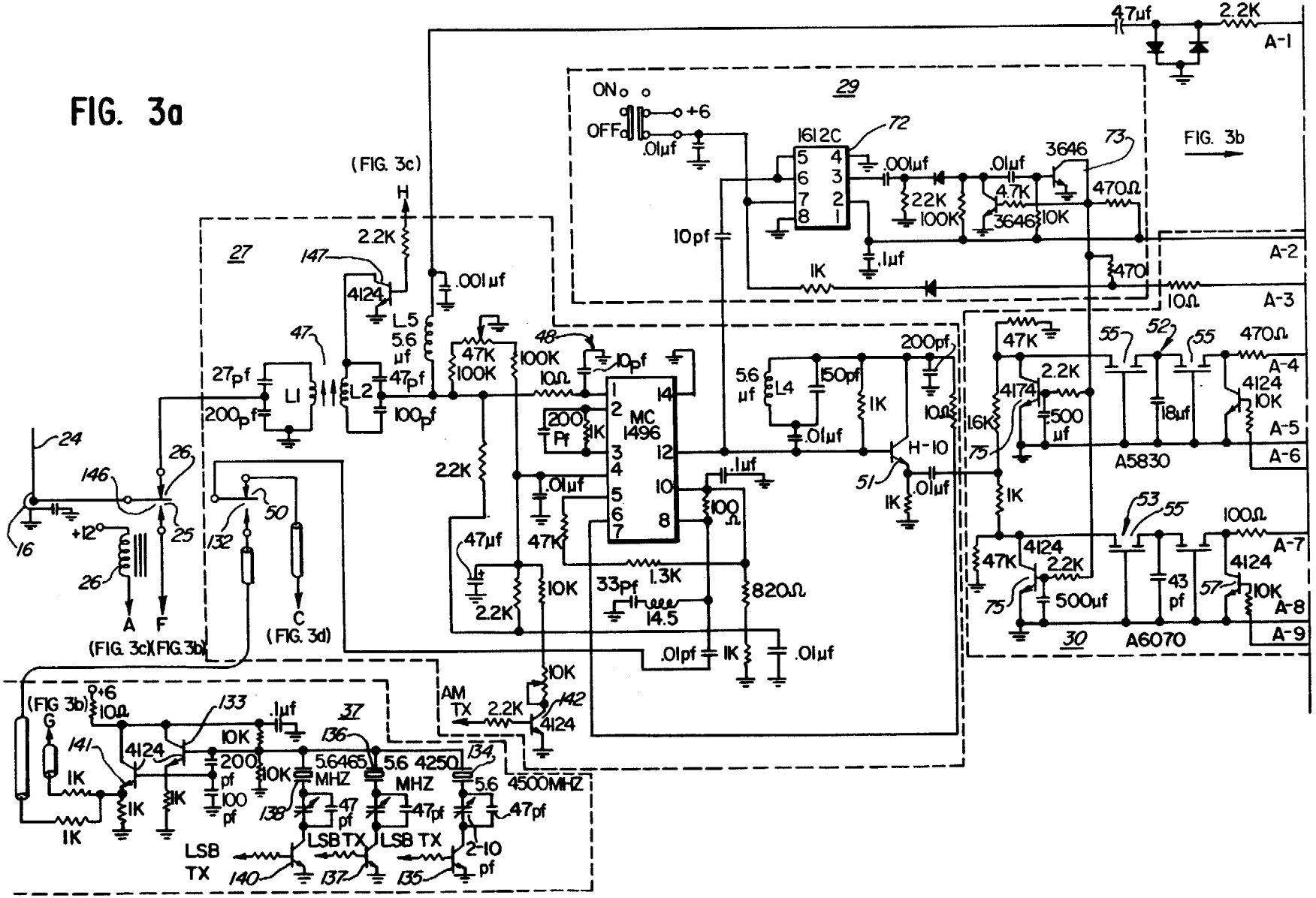
Figure 3B:
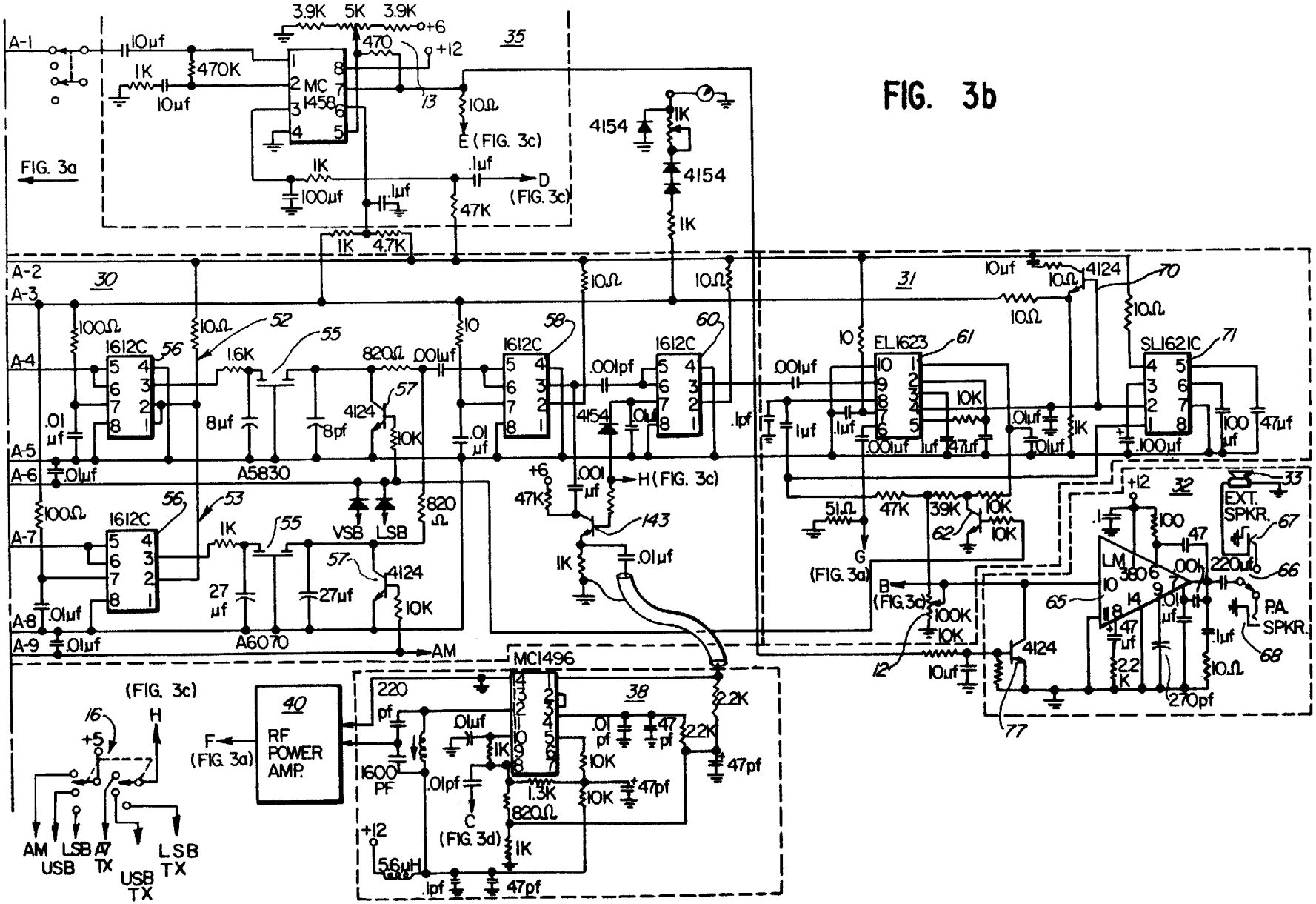

More particularly, as shown in FIG. 3a, in the receive mode, the incomming RF signal received by the antenna 24 is fed through an antenna jack 46 and the normally closed receive contact of the transmit-receive relay 26 to the front end 27. The front end 27 includes a preselector or a four pole band pass filter 47 for the CB band that also matches the impedance of the antenna to an input of a transistor double balance modulator-demodulator stage 48 used as a mixer on receive and as a modulator on transmit. During receive, the local oscillator signal generated by the frequency synthesizer 28, described hereinafter, is applied through a normally closed receive contact 50 of the transmit relay 26 to the mixer 48 to produce an IF signal.

The IF signal from the modulator-demodulator stage 48 is fed to an emitter follower 51, the input of which is tuned by an inductor and a capacitor to the IF frequency. The output of the emitter follower 51 is applied to the IF amplifier 30 and to the noise blanker amplifier 29, described hereinafter. There are two paths 52 and 53 in the IF amplifier 30 one 52 for the AM mode and the other 53 for the single sideband mode, the paths being identical in construction except for the bandwidth of the band pass of the paths. In this connection, each path includes a pair of two pole crystal filter networks 55 which determine the band pass of the path, and an IF amplifier 56, FIG. 3b, coupled between the filters 55. Each path is disabled by two transistor gates 57 that are closed by the manual switch 16 which selects the modes of operation, that is, AM, USB or LSB.

The output of the activated path is amplified by two stages 58 and 60 of amplification and is fed to a detector stage 61 which combines an AM detector, an AM AGC generator and a SSB product detector. For SSB detection, a carrier frequency generated by the carrier oscillator 37 is fed to the detector stage 61.

The detector stage 61 has two outputs which are mixed to form a common audio signal that is applied to the panel volume control 12. During SSB operation, one of the audio outputs of the detector stage is disabled by a transistor gate 62. A volume control 63 is also provided on the mike 36 and this volume control is connected in parallel with the center top of the panel volume control. The output of the panel volume control 12 is fed to an audio power amplifier stage 65 which is a conventional circuit. The output of the audio power amplifier stage 65 is connected through a switch 66 to an internal speaker 33, or to a jack 67 for an external speaker. The switch 66 connects a jack 68 for a PA speaker to the audio amplifier 65.

In the detector stage 61, the AM AGC is derived from the carrier envelope and is fed to an amplifier 70 that drives the AGC line. A separate AGC generator 71 is used for AGC in the single sideband mode. This separate AGC generator 71 derives the SSB AGC from the audio signal and its output is fed to the transistor amplifier 70.

As shown in FIG. 3a, the apparatus includes the impulse type noise blanker amplifier 29 which receives its output from the output of the modulator-demodulator 48. The noise blanker 29 detects a noise impulse and shuts off the IF amplifier 30. More particularly, the noise blanker 29 includes an amplifier stage 72 that amplifies any noise pulse at the output of the mod-demod 48 and feeds it into a one shot multivibrator 73 which gates the IF amplifier 30 on and off through transistor gates 75 in the input stages of the IF amplifier 30.

The squelch function is performed by monitoring the AGC level of the IF amplifier 30 and comparing this level to a preset voltage provided by the squelch control 13. More particularly, the AGC voltage from the AM detector stage 61 or the SSB detector 71 is applied to the squelch and mike preamp circuit 35 which serves as a voltage comparator to compare the AGC voltage with the preset squelch voltage from the squelch control 13 and provides a squelch control signal when the AGC voltage is larger than the squelch voltage thereby indicating a modulated RF signal is being received on the selected channel. The squelch control signal is applied to a transistor gate 77 at the input of the audio amplifier stage 65 to disable the audio amplifier stage when the received audio signal is less than the squelch voltage.

Figure 3C:
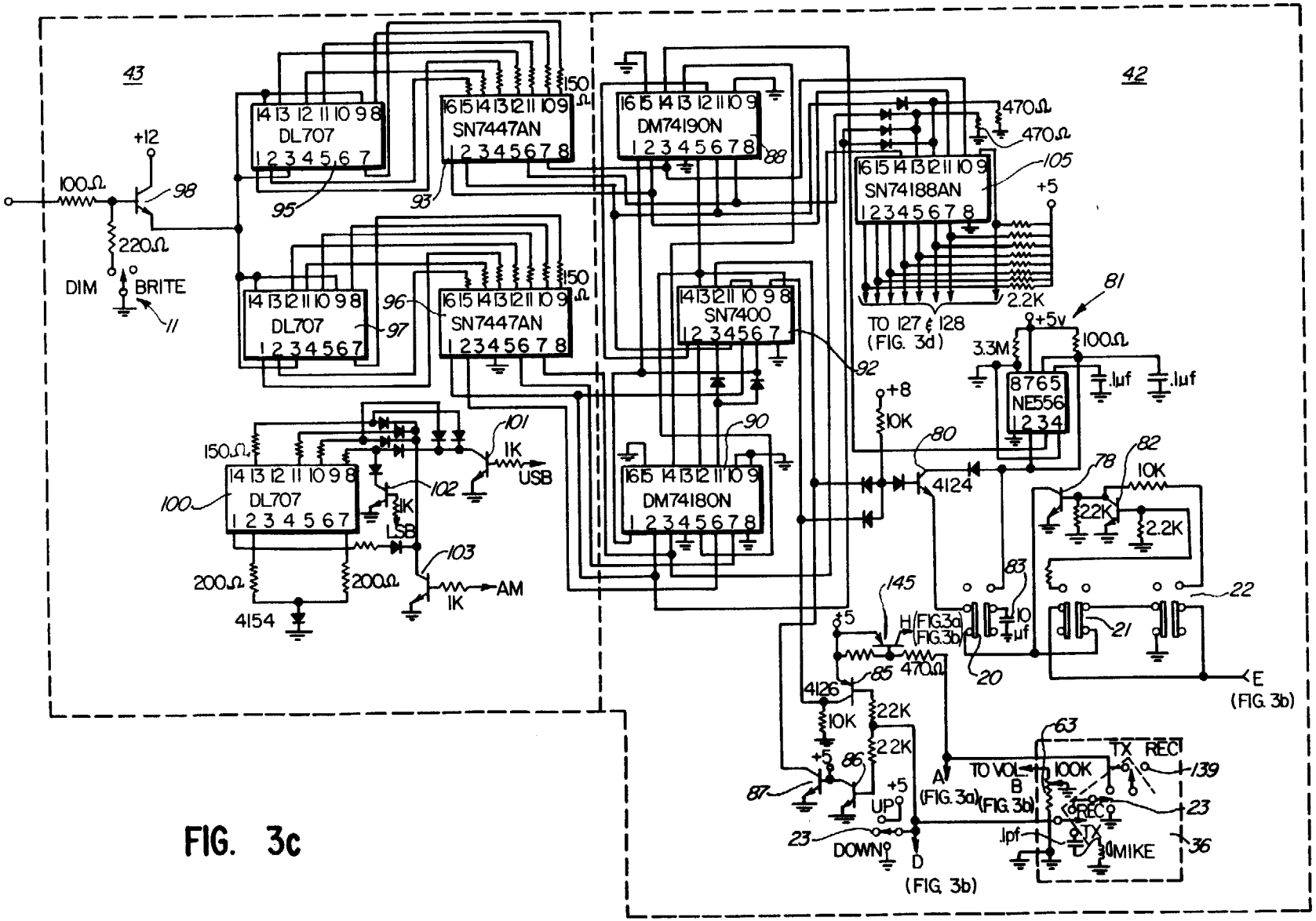

The squelch control signal is also applied to the active switch 21 and to the inactive or clear switch 22 as shown in FIG. 3C. When the stop clear switch 22 is actuated, the channel finder circuit 42 scans the channels as long as the control signal is present and stops its scanning in response to the absence of the control signal thereby indicating a clear channel. When the active switch is actuated, the channel finder scans the channels as long as no control signal is present and stops scanning in response to the receipt of the signal control thereby indicating that a signal is being received on the channel, that is, the channel is active. More particularly, in the clear mode, the squelch control signal is applied through a normally open contact of the clear switch 22 to a first inverting amplifier 78, the output of which is connected through a normally closed contact of the sample switch 20 and through a transistor OR gate 80 to a pulse generator 81. In stop active mode, the squelch control signal is applied through a normally open contact of the stop active switch 21 and then through a second inverting amplifier 82 to the first inverting amplifier 78. Thus, the pulse generator 81 runs free generating pulses when the squelch control signal is present during the stop inactive mode and when the squelch control signal is not present during the stop active mode.

When the sample switch 20 is actuated, the pulse generator 81 runs free generating pulses no matter whether the squelch control signal is present or not. In this connection, a normally closed contact of the sample switch 20 is opened disconnecting the squelch control signal from the pulse generator 81 and a normally open contact of the sample switch 20 is closed connecting the input of the pulse generator 81 to a timing circuit 83 which causes the pulse generator to free run at a slow rate.

As shown in FIG. 3C, the operation of the pulse generator 81 is also controlled by the channel select switch 23 so that the pulse generator 81 is inactive when the channel select switch is in the center off position and active when the channel select switch 23 is in either the up or the down position. The same results occur when the channel select switch located on the mike is operated. More particularly, with the channel select switch 23 in the center off position, transistor switches 85 and 86 are in their off condition thereby enabling gate 80. This pulls pin 2 of the pulse generator 81 low through switches 20, 21, 22. When pin 2 is low, the pulse generator 81 is inhibited and the transmitting-receiving apparatus remains on a selected channel. Placing up-down switch 23 in either the up or down position disables the switch 80 removing the clamp on pin 2 of the pulse generator 81, thereby allowing it to oscillate. It continues to oscillate causing the transmitting-receiving apparatus to seek new channels as long as the switch is in its up or down position.

The output of the pulse generator 81 drives a channel counter chain 88, 90 that increments or decrements according to the status of an up-down bistable flip-flop 92 which is coupled to the channel counter chain. The status of the up-down flip-flop 92 is determined by the last position of the channel select switch 23 which is coupled to the up-down flip-flip either through the inverter 85 or the pair of inverters 86 and 87.

The channel counter chain includes a units counter 88 and a tens counter 90 which count the pulses from the pulse generator 81. The output of the units counter 88 is applied through a decoder 93 to a units LED display 95 and the output of the tens counter 90 is applied through a decoder 96 to a tens LED display 97, which displays are located on the front panel and indicated by the reference numeral 10. The displays 95 and 97 are dimmed by the dimming switch 11 which actuates a transistor 98 which controls the voltage applied to the displays 95 and 97.

The apparatus also includes a LED display 100 for displaying the operating mode, namely, A for AM, L for LSB, or U for USB. This mode display is controlled by the mode switch 16 actuating respective transistor switches 101, 102 and 103 connected to the LED mode display 100.

The LED displays 95, 97 and 100 and the decoders 93 and 96 may also be disposed on the mike 36 rather than on the panel or, in alternative, two sets of displays and decoders may be provided, one on the panel and the other on the mike.

The output of the channel counter chain also sets the address for a PROM 105 that controls the operation of the frequency synthesizer 28. The PROM 105 is programmed to provide in response to a channel signal from the channel counter chain 99, 90, which signal may represent any channel in the CB band or bands, the proper divide code to cause the synthesizer to operate the transmitter portion of the apparatus at the RF frequency of that channel or the receiver portion such as to receive that channel.

Figure 3D:
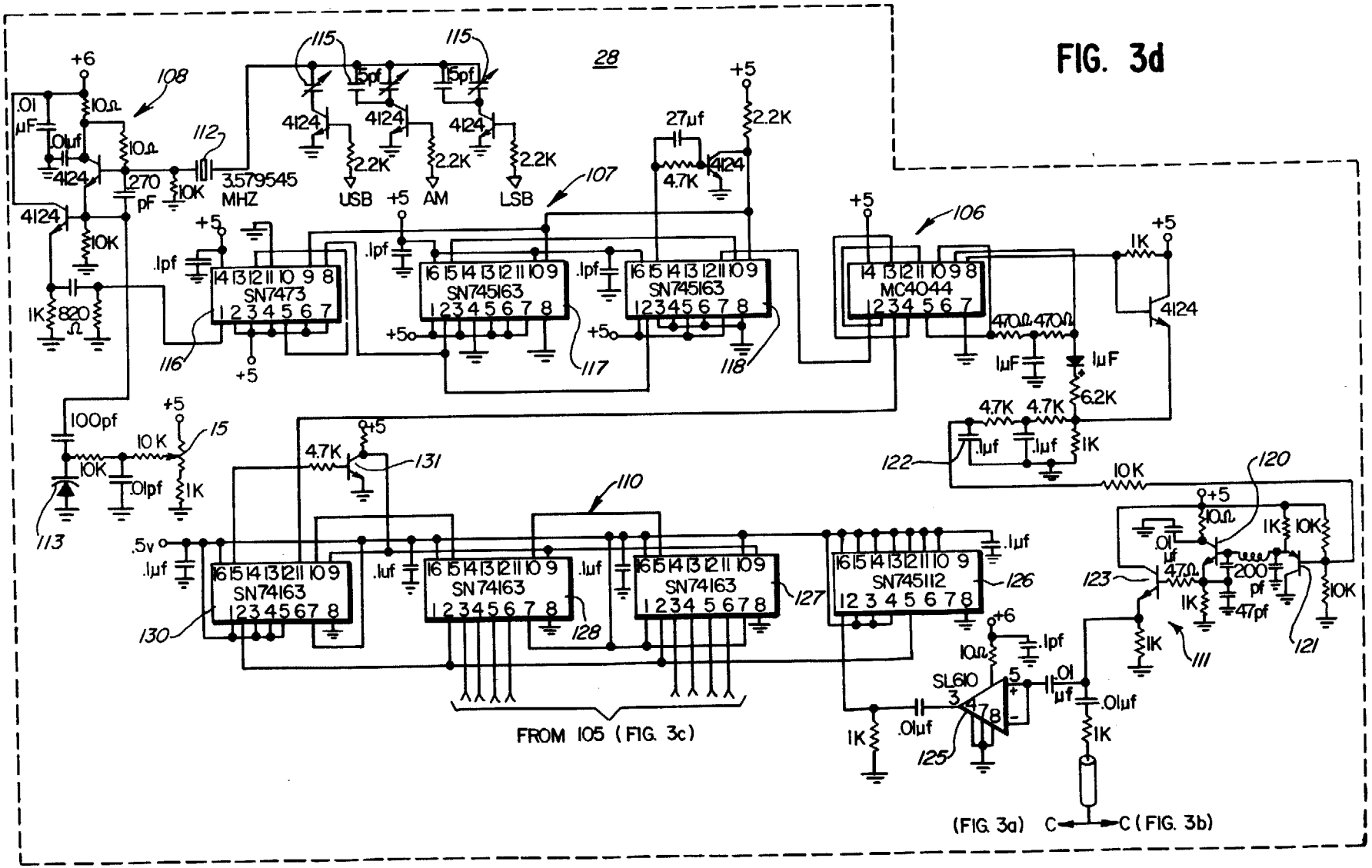

As shown in FIG. 3D, the synthesizer 28 includes a phase comparator 106 that compares the phase of a reference counter chain 107 driven from a reference oscillator 108 to the phase of a programmable counter chain 110 driven from a voltage controlled oscillator 111 (VCO). The reference oscillator 108 utilizes a standard tv color burst crystal 112 as a reference. The oscillator 108 is finely tuned by a varactor diode 113, the capacity of which is manually controlled by the fine tune knob 15. Three crystal loading capacitors 115 are respectively switched into the oscillator circuit 108 by the mode switch 16 to provide the AM frequency and the required frequency offsets for LSB and USB operations.

The reference frequency from the oscillator 108 is divided down by the reference divide chain 107 which includes a divide by two stage 116 and two counter stages 117 and 118. The divide code of the reference divider chain 107 is such that its output frequency, which is fed to the phase comparator 106 is equal to 5 kilohertz.

The illustrated VCO 111 includes a transistor 120 and its associated elements that operate as an oscillator, the frequency of which is shifted by the current variations in a transistor 121. The transistor 121 is used as a varactor diode in that it varies the base-emitter capacitance of the oscillator transistor 120 in accordance with its base voltage that is determined by the output of the phase comparator 106 coupled through a loop filter 122 to the base. The transistor 121 also temperature compensates the oscillator transistor 120 so that the open-loop temperature drift is relatively small.

The output of the VCO 111 is supplied to the local oscillator input of the modulator-demodulator 48 and to a local oscillator input of the transmit mixer 38, described hereinafter, through an emitter follower 123. The VCO 111 also drives the programmable divider 110 through an isolation amplifier 125 connected to the emitter follower 123, which isolation amplifier 125 prevents noise produced in the logic circuits from reaching the VCO outputs. The programmable divider 110 includes a predivider 126, which limits the frequency seen by the remainder of the programmable divider 110 to a relatively low frequency, for example about 10 mHz, and three synchronous up counters or registers 127, 128 and 130 with synchronous load. The binary code presented to two of the sync counters 127 and 128 is the complement of N−1, where:

$$N = \frac{Fch - Fif}{10\ kHz};$$

Fch equals the frequency of the channel; and Fif equals the IF frequency. When this number is loaded into the counters 127 and 128, the counters count up to full load (all one's) at which point the carry out goes high. This saturates a transistor switch 131, causing the load lines to become low. The next input pulse that occurs with the load line low reloads the counters 127 and 128 and the cycle repeats. The output of the last counter 130 in the chain is applied to the phase detector 106.

In the USB and LSB transmit modes and the AM transmit mode, a carrier frequency generated by the carrier oscillator circuit 37 is supplied to the modulator-demodulator 48 through a normally open transmit contact 132 of the transmit relay 26. In the illustrated embodiment, the carrier oscillator circuit 37 includes a transistor 133 and associated components plus an AM crystal 134 and a switching transistor 135, an USB crystal 136 and a switching transistor 137, and an LSB crystal 138 and a switching transistor 140. The switching transistors 135, 137 and 140 are respectively enabled by the mode switch to obtain the proper IF frequency to pass the AM signal through the IF amplifier and to offset the AM signal in the correct direction to enable the filters in the IF amplifier to provide USB or LSB as desired. The output of the carrier oscillator 37 is provided with an emitter follower 141 at its output. In addition to being supplied to the modulator-demodulator 48, the output of the carrier oscillator 37 is supplied to the detector 61 to serve as a reference for the product detector in the single sideband receive mode.

In the transmit mode, the output of the microphone 36 is fed through the normally open contact of one of the transmit-receive switches 139 into the squelch and mike preamp 35, which, in the transmit mode, amplifies the audio signal from the mike 36. The output of the mike preamp 35 is fed to the modulator-demodulator 48 to amplitude modulate the carrier frequency. If a transistor switch 142 connected to the modulator-demodulator 48 is in a non-saturated state, the carrier is suppressed and the modulator-demodulator 48 operates as a double sideband suppressed carrier type mixer. If the transistor switch 142 is rendered saturated by the AM transmit mode switch 16, the AM carrier along with its modulation products is obtained at the output of the modulator-demodulator 48. Thus, the output of the mod-demod 48 is either a double sideband suppressed carrier signal or a standard AM signal. This signal is then fed into the IF amplifier 30. In the AM mode, the signal passes through the upper path of the IF amplifier 52 and is applied to the transmit mixer 38 through a gate 143 which, in turn, is actuated by a transistor switch 145 enabled by the transmit-receive switch 139. The transmit-receive switch 139 also disables the output IF amplifier 60, thereby preventing the signal from being coupled to the detectors 61 and 71 and subsequent circuits. In the single sideband mode, the unwanted sideband is removed by the crystal filter in lower path 53 and the SSB output is fed to the transmit mixer 38.

The transmit mixer 38 converts the IF frequency which contains the modulated information up to the actual CB band. The IF frequency is mixed with the VCO signal to produce a selected transmitting frequency of a channel in the CB band.

The output of the transmit mixer 38 is applied to the linear RF power amplifier 40 which provides the additional gain required for 4 watt output in AM transmit and a 12 watt power output in single sideband transmit. The output of the RF power amplifier 40 is applied to a normally open transmit contact 146 of the transmit relay 26, where it is coupled to the external antenna 24 for transmission. The transmit relay 26 is energized by moving the transmit-receive switch 139 on the mike 36 to the transmit position. At the same time, a transistor switch 147 actuated by the transistor switch 145 grounds the preselector 47.

Another embodiment of the receive-transmit apparatus is shown in FIGS. 4A, 4B and 4C. Most of the stages of the receive and transmit sections of the apparatus while having slightly different component values and arrangement of components are similar in function to those shown in FIG. 3 and will not be described in detail. Stages in FIG. 4 that are similar in function to those in FIG. 3 are indicated with the same reference numerals with the subscript "a".

In the embodiment shown in FIG. 4A, the front end performs only the function of a receive mixer and includes a dual gate MOS FET mixer 148 that mixes the local oscillator signal from the VCO 111a and the RF signal from the preselector 47a. This type of front end 27a provides an increased dynamic range as compared to the front end 27 shown in FIG. 3. The output of the mixer 148 is applied through one of three IF paths 150, 151 and 152 (AM, USB and LSB) as determined by the mode switch 16a, and the output signal from the activated path is applied by two IF amplifier stages 56a. In the IF amplifier 30a shown in FIG. 4A, an IF frequency of 10.695 mHz is employed as compared to 5.645 mHz employed in FIG. 3. By using this increased frequency, smaller commercially available filters 55a may be employed, the image rejection of the receive section is improved and a commercially available synthesizer chip may be employed to generate the local oscillator frequency.

The noise blanker 29a is similar in function to that shown in FIG. 3. However, its output gates the input of the receive mixer 148 rather than the input of the IF amplifier circuit.

In the receive mode, the detected audio, either AM of SSB, from the detector 61a is fed into an audio preamplifier circuit 32a (FIG. 4B). This circuit includes two transistor stages 153 and 154 only one of which is switched on at any one particular time by the mode switch 16a. This allows the AM or SSB detected output to be amplified but yet reduces oscillations. The audio preamplifier transistors 153 and 154 are switched on and off by the squelch circuit 35a. The squelch circuit 35a includes an operational amplifier comparator 155 that compares the AGC level with the preset squelch control 13a. The output of the squelch circuit 35a switches off the audio preamplifier transistors 153 and 154, squelching the audio, when the AGC is below the preset level and switches the audio amplifier transistors on when the AGC level surpasses the preset level. In the audio preamplifier illustrated in FIG. 4B, a third transistor stage 156 is provided which is switched on during the public address (PA) mode for amplifying the audio from the mike 36A in the PA mode, as described hereinafter. The output of the audio preamplifier 32a is fed to a volume control 12a, after which it is applied to the input of the audio power amplifier 32a. The power amplifier 32a includes a pair of operation amplifiers 157 and 158 operating in a balance bridge configuration, whereby the speaker 33a connected to the output of the bridge configuration floats above ground. This permits a higher audio output power while using a chip which is not rated for such dissipation. This configuration has the advantage that you can obtain approximately three times the power output that you would normally associate with an amplifier running off the supply voltage.

In the transmit mode, the microphone 36a is connected to an audio amplifier 160 with internal AGC designed to provide a constant output voltage over a large dynamic range of inputs. One such amplifier is an SL1622 manufactured by Plessey Semiconductors. The output of this audio amplifier 160 is coupled to the PA amplifier 156 in the audio preamplifier 32a in the PA mode or to a variable gain audio amplifier stage 161 in the transmit mode. The gain of this stage 161 is set at one of two fixed levels by a transistor switch 162 which is switched by the mode switch. This provides the levels for the audio signal required at the transmit modulator 27a for transmitting AM or SSB.

As shown in FIG. 4B, the transmit modulator 27a consists of a double balance modulator 163. In the SSB mode, the modulator 163 is balanced by a balance control 165 whereby the carrier is suppressed and the output consists of both sidebands. In the AM mode, the balance is disturbed by the mode switch 16a such that the output of the modulator 163 includes the carrier, whereby the output is a standard AM signal. The modulator 163 modulates the carrier signal from the carrier oscillator 37a with the incoming audio from the audio amplifier 161. The carrier oscillator 37a is a conventional crystal oscillator configuration having a frequency of 10.695 mHz. The output of the modulator 163 is coupled to the input of the IF amplifier 30a (FIG. 4A).

As shown in FIG. 4A, the output of the IF amplifier 30a is applied to the transmit mixer 38a wherein the IF signal is mixed with the local oscillator from the VCO 111a. The signal output from the transmit mixer 38a is applied to the RF linear power amplifier 40a. This power amplifier circuit configuration may also be used for the power amplifier 40 of FIG. 3. The RF linear power amplifier 40a includes two low level amplifier stages 166 and 167. The output of the second amplifier stage 167 is fed into an RF power amplifier driver stage 168 and its output is then matched into a power amplifier stage 170 that supplies the power which is transmitted by the antenna 24a. The output of power amplifier stage 170 is matched by a network 171 to the antenna. A 54 megahertz trap 172 for TV interference is also provided on the connection to the antenna 24a.

The output of the power amplifier 171 is also fed to a level control circuit 173 that continuously monitors and corrects the power output such that it does not exceed FCC specifications. The illustrated level control circuit 173 includes two paths 175 and 176, the upper path 175 for SSB mode and lower path 176 for the AM mode. In the SSB mode, the peak of the SSB signal being transmitted is detected by a peak level detector 177 and is applied to a filter network 178 to thereby supply a DC control voltage that is proportional to the peak envelope power. In the AM mode, the AM signal to be transmitted is rectified by a conventional rectifier configuration 180 that provides a DC control voltage which is buffered by an emitter follower 181. These two DC control voltages are switched by respective transistor switches 182 and 183, which are controlled by the mode switch 16a, to provide a DC voltage that controls the gain of the IF amplifiers 56a used as a part of the amplifier chain in transmit. By doing so, the actual power output is continuously monitored and corrected such that it does not exceed FCC specifications.

As shown in FIG. 4A, a transmit-receive switch 139a on the mike energizes the transmit circuits and deenergizes the receive circuits during transmit and deenergizes the transmit circuits and energizes the receive circuits during receive by controlling transistor switches 185 connecting power to the respective circuits. The mode switch 16a conditions the apparatus for AM, USB or LSB operation as selected by the operator.

FIG. 4C shows the synthesizer 28a employed in the second embodiment of the receive-transmit apparatus. The synthesizer includes an integrated circuit chip 186 which in the illustrated embodiment is an 80 channel digital synthesizer chip, NC6405, made by Nitron. This chip contains all the logic to implement up-down channel selection and, in this connection, contains a phase comparator, a reference divider for the phase comparator, and a large portion of the programmable divider. An external, variable modulus predivider or prescaler 187 is provided for the programmable divider in the synthesizer chip 186 and includes a counter 188 connected to the RS output of the chip 186. The output of the counter 188 is connected to a NAND gate 190 that feeds the in phase unknown clock input of the chip. The output of the NAND gate 190 is inverted by an inverter 191 and the inverted signal is fed the out-of-phase-unknown-clock-pulse input of the chip.

The synthesizer chip 186 receives a reference frequency at its reference clock input from the reference oscillator 108a that is a crystal oscillator operating at a frequency of 2.56 megahertz. The oscillator 108a includes a clarifier adjustment 192 provided by two varicaps 193 and 195. During transmit the clarifier adjustment 192 is shunted by a switch 193 (FIG. 4a) operated by the transmit relay.

The illustrated synthesizer chip 186 also contains all the logic to implement the channel number and to increment and decrement that number. It has eight outputs, which are two BCD words. The two words are applied to the respective decoder drivers 93a and 96a which, in turn, drive the two LED displays 95a and 97a. The LED displays 95a and 97a are powered by an oscillator circuit 197 that is intensity modulates the displays 95a and 97a. Incoming ambient light is sensed by a cadium sulphide photocell 198 that controls the duty cycle of the oscillator circuit 197, the output of which controls a transistor switch 199 to thereby control the voltage applied to the LED displays 95a and 97a.

As shown in FIG. 4C, the VCO output of the synthesizer chip 186 is coupled to one input of an operational amplifier 200 that is used as a DC buffer amplifier, the output of which controls a variactor 201 in the VCO circuit 111a, which has a nominal frequency of 37 megahertz. The output of the VCO circuit 111a is fed into two separate buffer amplifiers 202 and 203, one 202 of which is a switching buffer amplifier that drives the variable modulus predivider 188. The other buffer amplifier 203 is a linear buffer having a tuned collector circuit 205. The output of the linear buffer amplifier 203 is coupled to the transmit mixer 38a and to the receive mixer 148.

The FIG. 4C, the control circuits 42a for the channel finder function are shown to the left of the synthesizer chip 186. The operation of these control circuits 42a is essentially identical to the control circuits shown in FIG. 3 except for the use of integrated circuits instead of discrete transistors. More particularly, the output of the squelch control circuit 35a is fed into an inverter 206. The input or output of this inverter 206 is selected by the clear scan switch 22a or the active scan switch 21a. The selected output is applied to a scan delay circuit 207 which is a one shot multivibrator. This scan delay circuit 207 causes the apparatus to remain on either the active or inactive channel that it is stopped at for approximately three seconds after the transmission ceases. This allows the operator to listen to a reply to a conversation if he was listening to an active channel.

The output of the scan delay circuit 207 is applied to the resistor/capacitor input of synthesizer chip 186 to increment or decrement the counter in the synthesizer chip 186, depending upon the last position of the up-down switch 23a. In this connection, the rate of the internal oscillator in the chip is normally determined by the timing circuit 208 and it is normally at a fast rate of scan. The output of the scan delay 207 enables this circuit. The up-down switch 23a is connected to the slow up and slow down terminals of the chip 186.

For the sampling mode, the sample switch 20a is closed to thereby connect another timing circuit 210 to the internal oscillator. This timing circuit causes the internal oscillator to operate at a relatively slow scan speed. This timing circuit 210 is also connected to the internal oscillator by actuation of the up-down switch 23a that enables a NAND gate 211 which enables the timing circuit 210.

A store-recall mode is provided to enable the operator to switch to any stored channel when desired. More particularly, a storage-recall switch 212 is provided which in the store position causes the channel number of the channel then being received by the apparatus to be stored in the chip 186. The apparatus may be changed to this channel at any time by moving the switch 212 to its recall position. To enable the apparatus to quickly switch to that channel, the internal oscillator is enabled to operate at a fast rate by the NAND gate 214. When the switch 212 is released, the apparatus is returned to its normal mode and increments or decrements one channel from where it was due to the action of NAND gate 213. A NAND gate 215 energizes a position on the display when the memory is being used.

A circuit 216 is provided for the synthesizer chip 186 to prevent transmission during a time when the synthesizer 186 is not locked to a channel. The apparatus will not transmit unless the channel finder switch bank is in its stop position (that is the stop button 18a is depressed). The circuit 216 interrupts the circuit to the transmit-receive switch in the mike. This prevents an operator from scanning through the channels and transmitting on all channels as it scans.

Also, if the synthesizer should become unlocked or if during power initialization, the synthesizer should generate on an illegal channel, a circuit 217 is provided for likewise defeating the transmitter. A circuit 218 is also provided for blanking the display and for likewise defeating the transmitter when the apparatus is in the public address mode.

It is of course understood that although preferred embodiments of the present invention have been illustrated and described, various modifications thereof will become apparent to those skilled in the art, and, accordingly, the scope of the present invention should be defined only by the appended claims and equivalents thereof.

What is claimed is:

1. Apparatus for transmitting and for receiving a selected one of a plurality of predetermined radio frequency channels located in an RF band, said apparatus comprising:

a frequency synthesizer means for generating a selected one of a plurality of local oscillator signals;

an antenna means;

an RF receiving section for the RF band including an RF mixer, means connecting said antenna means to said mixer to thereby apply received RF signals to said mixer, means for applying to said mixer said selected local oscillator signal to thereby provide at the output of the mixer an IF signal modulated with any audio signal being received on the selected channel, an IF amplifier connected to said mixer for amplifying said IF signal, detector means connected to said IF amplifier for detecting said audio signal, an audio amplifier connected to said detector means for amplifying said audio signal, and means for connecting an audio speaker to said audio amplifier;

squelch means responsive to the receipt of said audio signal for providing a squelch control signal indicative of the presence of an audio signal on the selected channel, said squelch means responsive to the absence of said audio signal for disabling said audio amplifier;

an RF transmitting section for the RF band including a carrier oscillator for producing a carrier signal, means for generating an audio signal, means connected to said carrier oscillator and said generating means for modulating said carrier signal with said audio signal, means connected to said modulating means for amplifying said modulated signal, a transmit mixer connected to said amplifying means and to said frequency synthesizer means for mixing said selected local oscillator signal with said modulated signal, means connected to the output of said transmit mixer for amplifying said transmit mixer output, and means for connecting said amplifying means to said antenna means to thereby transmit on said selected channel;

manually operable means for energizing either said transmit section or said receive section;

said frequency synthesizer means including a phase-locked-loop and being operable to provide said selected local oscillator signal in response to a preselected input signal being applied thereto;

memory means for storing a plurality of said preselected input signals corresponding to said plurality of channels;

means for scanning said memory means to apply said plurality of preselected input signals in sequence to said frequency synthesizer means; and first manually selectable means responsive to said squelch control signal for enabling said scanning means when said squelch control signal is present and for disabling said scanning means when said squelch control signal is absent, whereby the channels are scanned to locate an empty channel for transmission; second manually selectable means responsive to said squelch control signal for enabling said scanning means when said squelch control signal is absent and for disabling said scanning means when said squelch control signal is present, whereby the channels are scanned to locate [a transmitting channel] *an active channel for reception.*

2. Apparatus in accordance with claim 1, wherein said first and said second selectable means cause said scanning means to scan said memory means at a fast rate, and wherein a third manually selectable means is provided for enabling said scanning means at a slow rate and a fourth manually selectable means is provided for disabling said slow rate of scanning.

3. Apparatus in accordance with claim 1 wherein said preselected input signals stored in said memory means are arranged in accordance with predetermined channel numbers, and a third manually selectable means is provided for causing said scanning means to scan said memory means either incrementally or decrementally in channel number at a fast rate.

4. Apparatus in accordance with claim 2 wherein said preselected input signals stored in said memory means are arranged in accordance with predetermined channel numbers, and a fifth manually selectable means is provided for causing said scanning means to scan said memory means to either increment or decrement in channel number at a fast rate.

5. Apparatus in accordance with claim 3 wherein means are provided for determining the last manual selection of said third manually selectable means and causing said scanning means to scan said memory means incrementally or decrementally in channel number depending upon said determined last manual selection and in response to said enablement by said first and said second manually selectable means.

6. Apparatus in accordance with claim 4 wherein means are provided for determining the last manual selection of said fifth manually selectable means and causing said scanning means to scan said memory means incrementally or decrementally in channel number depending upon said determined last menual selection and in response to said enablement by said first and said second manually selectable means.

7. Apparatus in accordance with claim 5 wherein said audio generating means is a microphone, and wherein said manually operable energizing means and said third manually selectable means are disposed on said microphone.

8. Apparatus in accordance with claim 1 wherein display means are provided for displaying information indicative of the frequency of the selected channel and the energized receiving or transmit section.

9. Apparatus in accordance with claim 7 wherein display means are provided for displaying information indicative of the frequency of the selected channel and the energized receiving or transmit section.

10. Apparatus in accordance with claim 9 wherein the display means is disposed on the microphone.

11. Apparatus in accordance with claim 8 wherein manually selectable means are provided for dimming said display means.

12. Apparatus in accordance with claim 11 wherein means are provided for automatically dimming said display means in accordance with ambient light.

13. Apparatus for transmitting and for receiving a selected one of a plurality of predetermined radio frequency channels located in an RF band, said apparatus comprising:

a frequency synthesizer means for generating a selected one of a plurality of local oscillator signals;

an antenna means;

an RF receiving section for the RF band including an RF mixer, means connecting said antenna means to said mixer to thereby apply received RF signals to said mixer, means for applying to said mixer said selected local oscillator signal to thereby provide at the output of the mixer an IF signal modulated with any audio signal being received on the selected channel, an IF amplifier connected to said mixer for amplifying said IF signal, detector means connected to said IF amplifier for detecting said audio signal, an audio amplifier connected to said detector means for amplifying said audio signal, and means for connecting an audio speaker to said audio amplifier;

means responsive to the receipt of said audio signal for providing a control signal indicative of the presence of an audio signal on the selected channel;

an RF transmitting section for the RF band including a carrier oscillator for producing a carrier signal, means for generating an audio signal, means connected to said carrier oscillator and said generating means for modulating said carrier signal with said audio signal, means connected to said modulating means for amplifying said modulated signal, a transmit mixer connected to said amplifying means and to said frequency synthesizer means for mixing said selected local oscillator signal with said modulated signal, means connected to the output of said transmit mixer for amplifying said output, and means for connecting said amplifying means to said antenna means to thereby transmit on said selected channel;

manually operable means for energizing either said transmit section or said receive section;

said frequency synthesizer means including a phase-locked-loop and being operable to provide said selected local oscillator signal in response to a preselected input signal being applied thereto;

memory means for storing a plurality of said preselected input signals corresponding to said plurality of channels;

[processing] *circuit* means for controlling said frequency synthesizer means and for retrieving said preselected input signals from said memory means, said [processing] *circuit* means being adapted to operate in a clear channel finder mode wherein said preselected input signals concerning said channels are retrieved sequentially from said memory means in response to the presence of said control signal and are applied to said frequency synthesizer means; said sequential retrieval terminating during the absence of said control signal when [the] *a* retrieved preselected input signal corresponds to a clear channel available for transmission and in an active channel finder mode wherein said various preselected input signals concerning said channels are retrieved sequentially from said memory means in response to the absence of said control signal and are applied to said frequency synthesizer means, said sequential retrieval terminating during the presence of said control signal when [the] *a* retrieved preselected input signal corresponds to an active channel available for reception.

14. Apparatus in accordance with claim 3 wherein a fourth manually selectable means is provided for enabling said scanning means to apply each of said plurality of preselected input signals to said frequency synthesizer means for a predetermined sample time period, and means for disabling said first and second manually selectable means during operation of said third manually selectable means.

15. Apparatus in accordance with claim 1 wherein said second manually selectable means enables said scanning means to resume scanning for a transmitting channel upon termination of the presence of said squelch control signal.

16. Apparatus in accordance with claim 15 wherein said first manually selectable means enables said scanning means to resume scanning for an empty channel upon termination of the absence of said squelch control signal.

17. Apparatus in accordance with claim 14 further including display means for displaying the channel number corresponding to the preselected input signal being applied to said frequency synthesizing means.

18. Apparatus in accordance with claim 1 wherein manually selectable mode select circuit means is provided for operating said RF receiving section and said RF transmitting section in either an amplitude modulation or a single side band mode.

19. Apparatus in accordance with claim 13 wherein said [processing] *circuit* means is adapted to operate in a channel sample mode wherein each of said various preselected input signals are applied sequentially to said frequency synthesizer means for a predetermined sample period.

20. Apparatus in accordance with claim 13 further comprising means for displaying the clear channel corresponding to the preselected input signal on which said sequential retrieval terminated while said [processing] *circuit* means operates in said clear channel finder mode.

21. Apparatus in accordance with claim 13 further comprising supplemental memory means and wherein said [processing] *circuit* means is adapted to operate in a channel store and recall mode wherein manually selectable store switch means is provided for enabling said [processing] *circuit* means to store in said supplemental memory means the preselected input signal corresponding to the selected local oscillator signal and wherein manually selectable recall switch means is provided for enabling said [processing] *circuit* means to apply said preselected input signal stored in said supplemental memory means to said frequency synthesizer means.

22. Apparatus for transmitting and for receiving an audio information signal on a selected one of a plurality of predetermined radio frequency channels, said apparatus comprising:

frequency synthesizing means responsive to a preselected input signal being applied thereto for generating a selected one of a plurality of local oscillator frequencies corresponding to said radio frequency channels;

antenna means;

an RF receiving section connected to said antenna means and said frequency synthesizing means, said RF receiving section responsive to said selected local oscillator frequency for receiving said audio information signal on the corresponding radio frequency channel;

means responsive to the receipt of said audio information signal for providing a control signal representative of the presence of an audio information signal on the selected radio frequency channel;

an RF transmitting section connected to said frequency synthesizing means and responsive to said selected local oscillator frequency for transmitting at said antenna means audio transmission signals on the selected radio frequency channel;

switch means for energizing either said RF transmitting section or said RF receiving section;

memory means for storing a plurality of preselected input signals corresponding to said plurality of predetermined radio frequency channels;

channel finder circuit means for locating a desired one of said predetermined radio frequency channels, said channel finder circuit means including:

means for scanning said memory means to apply said plurality of preselected input signals in sequence to said frequency synthesizing means;

first manually selectable means responsive to said control signal for enabling said scanning means during the presence of said control signal and for disabling said scanning means during the absence of said control signal whereby the channels are automatically searched to locate an inactive channel;

second manually selectable means responsive to said control signal for enabling said scanning means during the absence of said control signal and for disabling said scanning means during the presence of said control signal, whereby the channels are searched to locate an active channel; and switch means for manually disabling said first and said second manually selectable means.

*23. Apparatus for transmitting and for receiving a selected one of a plurality of predetermined radio frequency channels located in an RF band, said apparatus comprising:*

*a frequency synthesizer means for generating a selected one of a plurality of local oscillator signals corresponding to said plurality of predetermined radio frequency channels;*

*an antenna means;*

*an RF receiving section for the RF band for providing output audio signals upon reception of incoming audio modulated RF signals including an RF mixer, means connecting said antenna means to said mixer to thereby apply received RF signals to said mixer, means for applying to said mixer said selected local oscillator signal to thereby provide at the output of the mixer an IF signal modulated with any audio signal being received on the selected channel, an IF amplifier connected to said mixer for amplifying said IF signal, detector means connected to said IF amplifier for detecting said audio signal, an audio amplifier connected to said detector means for amplifying said audio signal, and means for connecting an audio speaker to said audio amplifier;*

*squelch means responsive to an output of said RF receiving section for providing a squelch control signal, said squelch means disabling said audio amplifier when said squelch control signal is absent;*

*an RF transmitting section for the RF band connected to said frequency synthesizing means and responsive to said selected local oscillator frequency for transmitting at said antenna means audio transmission signals on the selected radio frequency channel;*

*manually operable means for energizing either said transmit section or said receive section;*

*said frequency synthesizer means including a phase-locked-loop and being operable to provide said selected local oscillator signal in response to a preselected input signal being applied thereto;*

*scanning means for applying a plurality of said preselected input signals corresponding to said plurality of channels in sequence to said frequency synthesizer means;*

*first manually selectable means responsive to said squelch control signal for enabling said scanning means when said squelch control signal is present and for disabling said scanning means when said squelch control signal is absent, whereby the channels are scanned to locate an empty channel for transmission; and*

*second manually selectable means responsive to said squelch control signal for enabling said scanning means when said squelch control signal is absent and for disabling said scanning means when said squelch control signal is present, whereby the channels are scanned to locate an active channel for reception.*

*24. Apparatus for transmitting and for receiving a selected one of a plurality of predetermined radio frequency channels located in an RF band, said apparatus comprising:*

*a frequency synthesizer means for generating a selected one of a plurality of local oscillator signals corresponding to said plurality of predetermined radio frequency channels;*

*an antenna means;*

*an RF receiving section for the RF band including an RF mixer, means connecting said antenna means to said mixer to thereby apply received RF signals to said mixer, means for applying to said mixer said selected local oscillator signal to thereby provide at the output of the mixer an IF signal modulated with any audio signal being received on the selected channel, an IF amplifier connected to said mixer for amplifying said IF signal, detector means connected to said IF amplifier for detecting said audio signal, an audio amplifier connected to said detector means for amplifying said audio signal, and means for connecting an audio speaker to said audio amplifier;*

*squelch means for providing a squelch control signal;*

*an RF transmitting section for the RF band connected to said frequency synthesizing means and responsive to said selected local oscillator frequency for transmitting at said antenna means audio transmission signals on the selected radio frequency channel;*

*manually operable means for energizing either said transmit section or said receive section;*

*said frequency synthesizer means including a phase-locked-loop and being operable to provide said selected local oscillator signal in response to a preselected input signal being applied thereto;*

*circuit means for controlling said frequency synthesizer means and for applying said preselected input signals to said frequency synthesizer means, said circuit means being adapted to operate in a clear channel finder mode wherein said preselected input signals concerning said channels are applied sequentially to said frequency synthesizer means in response to the presence of said control signal, said sequential application terminating during the absence of said control signal when an applied preselected input signal corresponds to a clear channel available for transmission, and in an active channel finder mode wherein said various preselected input signals concerning said channels are applied sequentially to said frequency synthesizer means in response to the absence of said control signal, said sequential application terminating during the presence of said control signal when an applied preselected input signal corresponds to an active channel available for reception.*

* * * * *